(12) United States Patent
Sadowski

(10) Patent No.: US 6,891,410 B2
(45) Date of Patent: May 10, 2005

(54) METHOD AND APPARATUS FOR DETERMINING A PROCESSING SPEED OF AN INTEGRATED CIRCUIT

(75) Inventor: Greg Sadowski, Cambridge, MA (US)

(73) Assignee: ATI Technologies, Inc., Markham (CA)

( * ) Notice: Subject to any disclaimer, the term of this patent is extended or adjusted under 35 U.S.C. 154(b) by 6 days.

(21) Appl. No.: 10/614,769

(22) Filed: Jul. 8, 2003

(65) Prior Publication Data

US 2005/0007165 A1 Jan. 13, 2005

(51) Int. Cl.$^7$ .............................................. H03H 11/26
(52) U.S. Cl. ...................................... 327/141; 327/261
(58) Field of Search ................................ 327/141, 142, 327/149, 261, 263, 407; 365/194

(56) References Cited

U.S. PATENT DOCUMENTS 6,081,462 A * 6/2000 Lee ............................. 365/194
6,353,906 B1 * 3/2002 Smith et al. ................. 714/741
6,477,186 B1 * 11/2002 Nakura et al. ............... 370/537
6,480,800 B1 * 11/2002 Molyneaux et al. ......... 702/120

* cited by examiner

Primary Examiner—Linh My Nguyen
(74) Attorney, Agent, or Firm—Vedder, Price, Kaufman & Kammholz, P.C.

(57) ABSTRACT

A method and apparatus for determining a processing speed of an integrated circuit includes a first flip flop having an input port receiving an input signal, an output port providing a flip flop output signal and a timing port receiving an incoming clock signal. The method and apparatus further includes a delay circuit operably coupled to the output port of the first flip flop, such that the delay circuit receives the flip flop output signal, generating a delayed timing signal. Further included is at least one clock speed adjusting circuit operably coupled to the delay circuit and a multiplexer coupled to the at least one clock speed adjusting circuit and the delay circuit, wherein the multiplexer receives a select delay signal in a selective delay input port. Based on the select delay signal, a multiplexer output signal is chosen and provided to an input port of a second flip flop.

27 Claims, 5 Drawing Sheets

METHOD AND APPARATUS FOR DETERMINING A PROCESSING SPEED OF AN INTEGRATED CIRCUIT

FIELD OF THE INVENTION

The present invention relates generally to integrated circuits and more specifically to determining a processing speed of the integrated circuit.

BACKGROUND OF THE INVENTION

An application specific integrated circuit (ASIC) is typically generated on a silicon wafer having a plurality of etchings for transmitting electrical signals and other chemical elements, such as Gallium Arsenide etched thereon for providing electrical functionality, such as transistors. In a typical assembly process, a plurality of integrated circuits are formed on a single wafer and portions of the wafer are tested to determine temperature, supply voltage and process variations. In a typical system, process variations are measured once during the production test of the ASIC and a speed grade is assigned to the individual integrated circuits. The temperature is measured in the system in which the integrated circuit is operating and the result is, in some designs, used for controlling a clock frequency. Moreover, voltage can be measured and the results used, by some designs, to control clock frequency.

The above-noted solutions treat the process variations, supply voltage and temperature measurements separately, and thereupon try to combine them on a system level. This solution may not lead to an optimal characterization of the performance characteristics of a specific integrated circuit due to relative intrinsic values, such as temperature dependency of multiple integrated circuits based on the number of process variations and differences in supply voltages.

Furthermore, when a plurality of integrated circuits are generated on a single wafer, the division of the individual integrated circuits from the wafer is typically performed by a cutting process. A binning operation is performed, wherein integrated circuits having specific performance levels are provided to specific corresponding bins. For example, if a fabricated wafer containing a plurality of integrated circuits contains integrated circuits having performance speeds within ten different ranges, the binning process consists of sorting and disbursing the integrated circuits into ten separate categories. The above-noted prior art performance determination process does not allow for binning of the specific integrated circuits, based on general testing and due to the reduction in the amount of die space in current fabricated integrated circuits.

As such, there exists a need for a method and apparatus that allows for determining a processing speed of an integrated circuit, wherein the integrated circuit may be on a wafer having a plurality of integrated circuits, wherein the performance speed is determined independent of process, voltage and temperature measurements and may be based on the execution of a system application on the integrated circuit. Moreover, there also exists a need for determination of processing speeds for integrated circuits of the plurality of integrated circuits to improve the binning process.

DETAILED DESCRIPTION OF A PREFERRED EMBODIMENT

Generally, a method and apparatus for determining a processing speed of an integrated circuit includes a first flip flop, such as a D flip flop, having an input port capable of receiving an input signal. The input signal may be any type of data signal, such as a pseudo-random generated signal. The first flip flop also has an output port which is capable of providing a flip flop output signal, in accordance with known flip flop technology, and a timing port capable of receiving an incoming clock signal. The incoming clock signal may be a timing signal having any suitable clock frequency for determining the processing speed of the integrated circuit.

The method and apparatus further includes a delay circuit operably coupled to the output port of the first flip flop, such that the delay circuit is capable of receiving the flip flop output signal and generating a delayed timing signal. The delay circuit includes one or more delay buffers and a plurality of gates which provide for a delay of the incoming flip flop output signal. The delayed timing signal furthermore may be a time-offset timing signal. The method and apparatus further include at least one clock speed adjusting circuit operably coupled to the delay circuit. Similar to the delay circuit, the clock speed adjusting circuits include delay buffers and various combinations of gates to provide for a specific timing offset.

The method and apparatus further includes a multiplexer operably coupled to the at least one clock speed adjusting circuit and the delay circuit, wherein the multiplexer further has a selective delay input port capable of receiving a select delay signal. The select delay signal may be a signal indicating which one of the clock speed adjusting circuits, if any, are to be chosen by the multiplexer as an output signal. Moreover, the multiplexer receives output signals generated by the clock speed adjusting circuits and the delay timing signal wherein the output signal generated by the delay timing signal is indicative of the lack of a clock speed adjusting circuit between the delay circuit and the multiplexer. Based on the select delay signal, a multiplexer output signal is chosen and provided to an input port of a second flip flop. In one embodiment, the second flip flop may be a D flip flop. The second flip flop further includes an output port capable of providing a timing output signal and a timing port capable of receiving the incoming clock signal. Therein, based upon a comparison of the timing output signal relative to a control timing signal, the processing speed of the integrated circuit may be determined.

Figure 1:
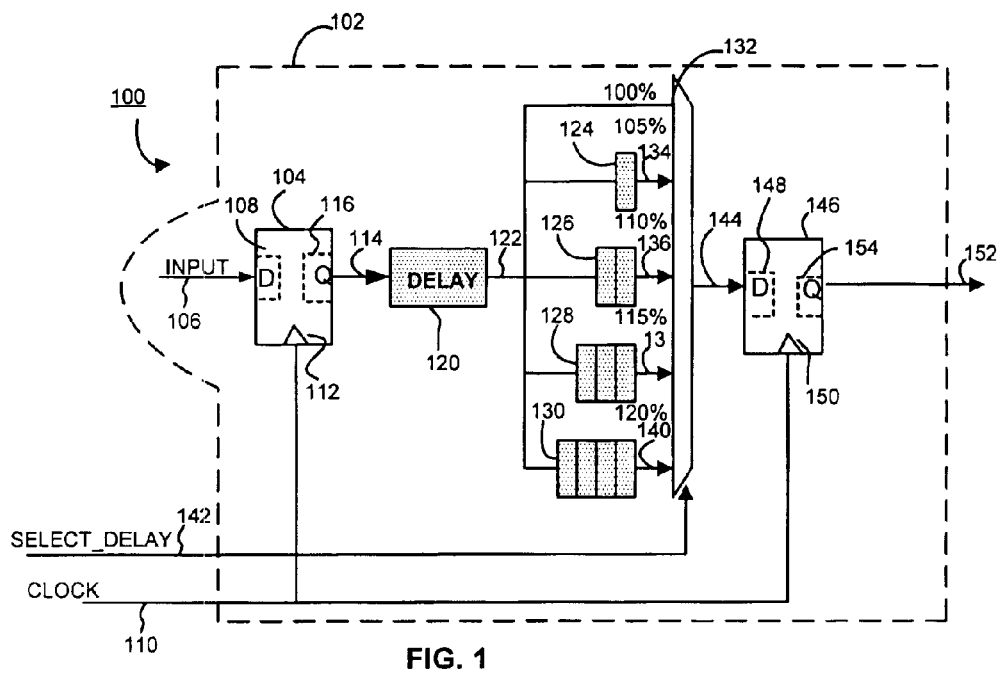
FIG. 1 illustrates an apparatus for determining a processing speed of an integrated circuit in accordance with one embodiment of the present invention.

More specifically, FIG. 1 illustrates an apparatus 100 for determining a processing speed of an integrated circuit 102, the apparatus 102 may also be disclosed as a speed sensor. As recognized by one having ordinary skill in the art, the apparatus 100 may be disposed within a die on an ASIC, wherein the apparatus 100 can determine performance characteristics relative to the corresponding ASIC circuit upon which the apparatus 100 is disposed thereon. The apparatus 100 includes a first flip flop 104, such as a D flip flop, capable of receiving an input signal 106 in an input port 108. The first flip flop 104 also receives a clock signal 110 in a timing port 112 and generates a flip flop output signal 114 provided via an output port 116. The apparatus also includes a delay circuit 120 capable of receiving the flip flop output signal 114 and therein generating a delayed timing signal 122, in accordance with known delay circuit technology.

The delay timing signal 122 is provided to a plurality of clock speed adjusting circuits, 124, 126, 128 and 130. The clock speed adjusting circuits, similar to the delay circuit 120, include delay buffers in various combinations of gates to provide for a specific clock signal delay. Moreover, the clock speed adjusting circuits 124, 126, 128 and 130 are illustrated in FIG. 1 as representing 105%, 110%, 115% and 120%, respectively. As recognized by one having ordinary skill in the art, these percentages are exemplary only and any other suitable offset delay may be provided by a correspondingly generated clock speed adjusting circuit.

A multiplexer 132 receives output signals 134, 136, 138 and 140 from the clock speed adjusting circuits and, in one embodiment, receives the delay timing signal 122 provided from the delay circuit 120. The multiplexer 132 further receives a select delay signal 142, wherein the select delay signal indicates which one of the delays, such as no delay at 100%, 105%, 110%, 115% or 120%, of the delay timing signal 122 is to be chosen as a multiplexer output signal 144. Therefore, in response to the select delay signal 142, the multiplexer 132 provides the multiplexer output signal 144 to a second flip flop 146, such as a D flip flop. An input port 148 of the second flip flop receives the multiplexer output signal 144, a timing port 150 of the second flip flop receives the incoming clock signal 110 and, in accordance with known flip flop technology, a timing output signal 152 is generated and provided via an output port 154 of the second flip flop.

Therefore, based on the timing output signal 152, a determination of the processing speed of the apparatus 100 may be determined wherein the processing speed is indicative of the processing speed of the integrated circuit 102, having the apparatus 100 sensor, disposed therein.

Figure 2:
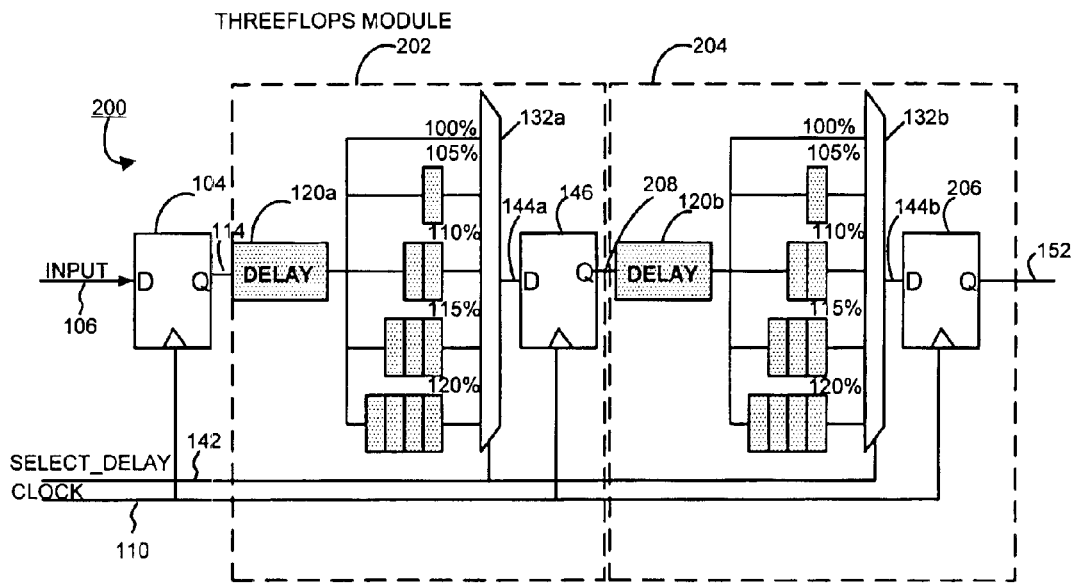
FIG. 2 illustrates a schematic block diagram of an apparatus for determining a processing speed of an integrated circuit in accordance with another embodiment of the present invention.

FIG. 2 illustrates an alternative embodiment of an apparatus for determining the processing speed of the integrated circuit 102, using a 3 flip flop module 200, otherwise referred to as a 3 flop module. Similar to the apparatus 100, the input signal 106 is provided to the first flip flop 104, wherein the first flip flop 104 provides the flip flop output signal 114 to a first delay module 202. The first delay module is further coupled to the second delay module 204, wherein the first delay module 202 and the second delay module 204 both receive the select delay signal 142 and the incoming clock signal 110.

The first delay module 202 contains elements similar to the apparatus 100 excluding the first flip flop 104. Both the first delay module 202 and the second delay module 204 include a delay circuit 120A and 120B, a multiplexer 132A and 132B, the first delay module 202 includes the second flip flop 146 to receive the multiplexer output signal 144A and the second delay module 204 includes a third flip flop 206 to receive the multiplexer 132B multiplexer output signal 144B.

The utilization of 3 flip flops, 104, 146 and 206, provides redundancy in the utilization of the delay modules 202 and 204 and provides for the timing output signal 152 to be more reliable when compared to a control clock signal, not specifically illustrated. The second delay module 204 receives an interim timing signal 208 from the first delay module 202, wherein the interim timing output signal 208 is similar to the timing output signal 152 containing a timed offset signal.

As recognized by one having ordinary skill in the art, the clock speed adjusting circuits 124, 126, 128 and 130 illustrated within the first delay module 202 and second delay module 204, are for exemplary purposes only and any other suitable clock speed adjusting circuit having a different clock speed adjusting value may be utilized therein.

Figure 3:
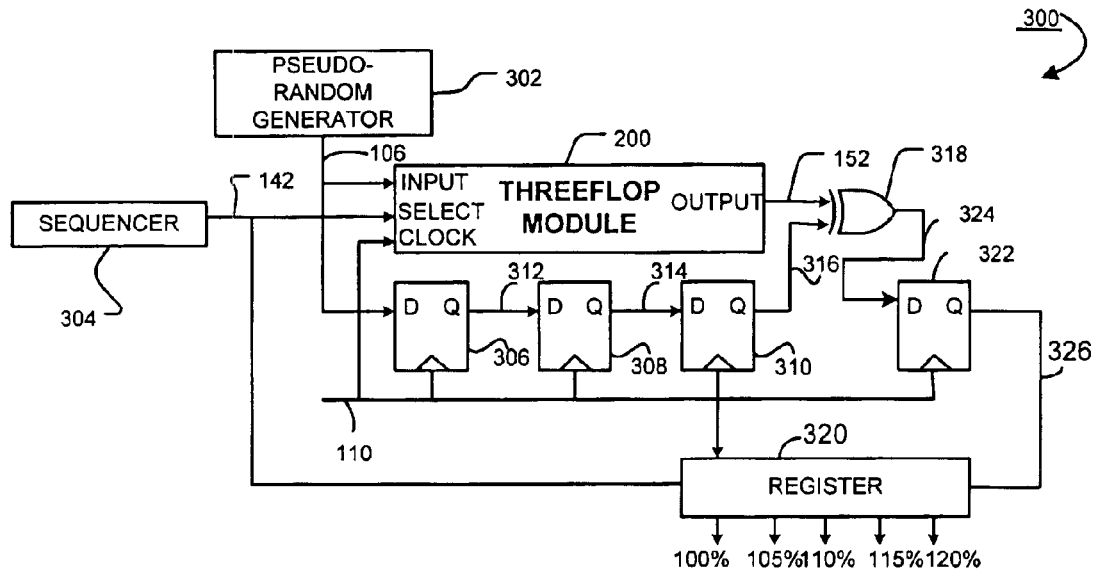
FIG. 3 illustrates a schematic block diagram of an alternative embodiment of an apparatus for determining a processing speed of an integrated circuit.

FIG. 3 illustrates another embodiment of an apparatus for determining a processing speed of an integrated circuit, including the three flop module, apparatus 200 of FIG. 2. The three flop module 200 receives the input signal 106 from a pseudo-random generator 302. The pseudo-random generator may be any type of input signal generation device or module such that a pseudo-random input signal 106 may be generated. The three flop module 200 further receives the select delay signal 142 from a sequencer 304. In one embodiment, the sequencer 304 may be a device or module capable of selecting different clock speed adjusting circuits to be chosen by the multiplexers 132 within the three flop module 200. In this embodiment, the sequencer 304 generates a plurality of select delay signals which may be used for repetitive and reiteration of selecting multiple timing sequences for being tested to determine the processing speed of the integrated circuit.

Further included within the apparatus 300 are a plurality of control timing flip flops 306, 308 and 310. The first of the control timing flip flops 306 receives the input signal 106 from the pseudo-random generator 302, provides an output signal 312 to the second flip flop 308 of the control timing flip flop and a second output signal 314 is provided to the third flip flop 310 of the control timing flip flops. In one embodiment, the three controlled timing flip flops 306, 308 and 310 are D flip flops which mirror the flip flops 104, 146 and 206 within the three flop module 200. The third flip flop 310 of the control timing flip flops generates a control timing signal 316, which is provided to a logic gate 318.

Control timing flip flops 306, 308 and 310 also receive the incoming clock signal 110, which is provided to the three flop module 200. The incoming clock signal 110 may be provided from any suitable clock sources recognized by one having ordinary skill in the art.

The logic gate 318 receives the control timing signal 316 and the timing output signal 152. In one embodiment, the logic gate 318 is an XOR gate for comparing the exclusive OR arrangement of the timing output signal 152 relative to the control timing signal 316.

The apparatus 300 further includes a register 320 operably coupled to receive the delay select signal 142 from the sequencer 304 and the incoming clock signal 110. Disposed between the register 320 and the logic gate 318 is a logic gate flip flop 322, such as a D flip flop. The logic gate flip flop 322 receives the incoming clock signal 110 and timing indicator signal 324 from the logic gate 318.

The logic gate flip flop 322 thereupon generates a timing result signal 326 which may be a signal indicating if the three flop module 200 was able to process the input signal 106 from the pseudo-random generator 302 at the speed designated by the delay timing signal 142. The register 320 receives the timing results signal 326 and storage this indicator therein.

In one embodiment, the above processes repeated using another pseudo-random generated input signal 106 and another select delay signal 142 from the sequencer 304. The processes repeated until the register 320 contains enough timing result signals 326 to make an accurate determination of the processing speed of the integrated circuit.

As recognized by one having ordinary skill in the art, logic gate 318 is illustrated here and as a XOR gate, but may be any other suitable combination of logic gates provided for the indicator 324 which is provided to the logic gate flip flop 322.

Figure 4:
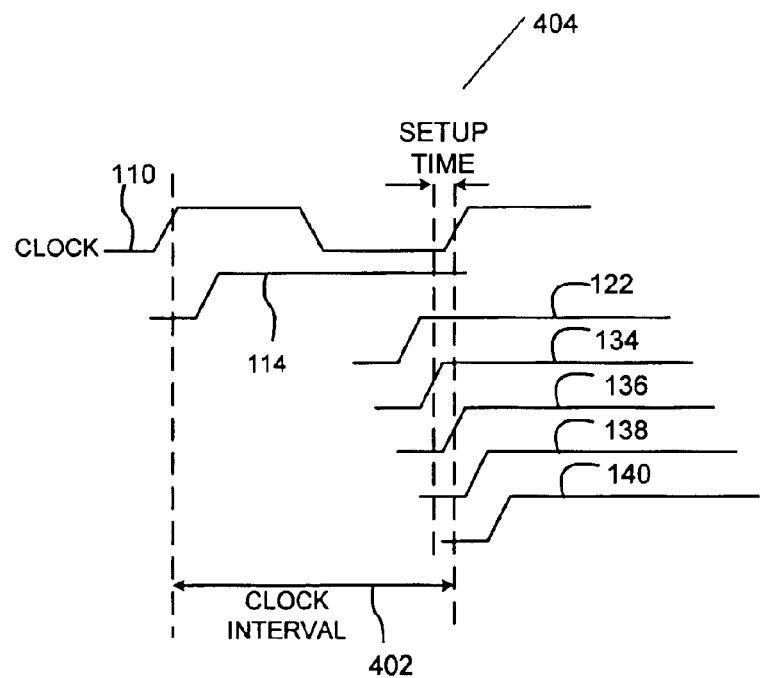
FIG. 4 illustrates a timing diagram representing timing signals generated by the apparatus for determining the processing speed of an integrated circuit.

FIG. 4 illustrates a timing diagram representing a clock signal 110 having a clock interval 402 relative to the timing sequence of multiple signals. The second timing signal represents the flip flop output signal 114 provided from the first flip flop 104 illustrated in FIG. 1. The other five timing signals represent timing transitions of the delay timing signal 122 and clock adjusted signal 134, 136, 138 and 140, as illustrated in FIG. 1 from the polarity of clocks speed adjusting circuits 124, 126, 128 and 130 respectively.

As illustrated herein, a setup time 404 indicates the transition of the incoming timing signal 110 from a low state to a high state as compared to the corresponding timing signals 122 and lock adjusted signals 134, 136, 138 and 140. In the exemplary illustrated timing diagram of FIG. 4, it is illustrated that the timing signal 136 corresponds to the incoming clock signal, therefore the apparatus 102 of FIG. 1 would be considered to be operating at a processing speed relative to a 10% delay. Based on the timing diagram of FIG. 4, the timing signals 122 and 134 meet the setup time 404 requirement for the second flip flop. 146 of FIG. 1. Timing signals 136, 138 and 140 violate the setup time which indicate that the caused delay is too much and therefore the value on the output of the second flip flop 146, output signal 152, may be wrong.

Figure 5:
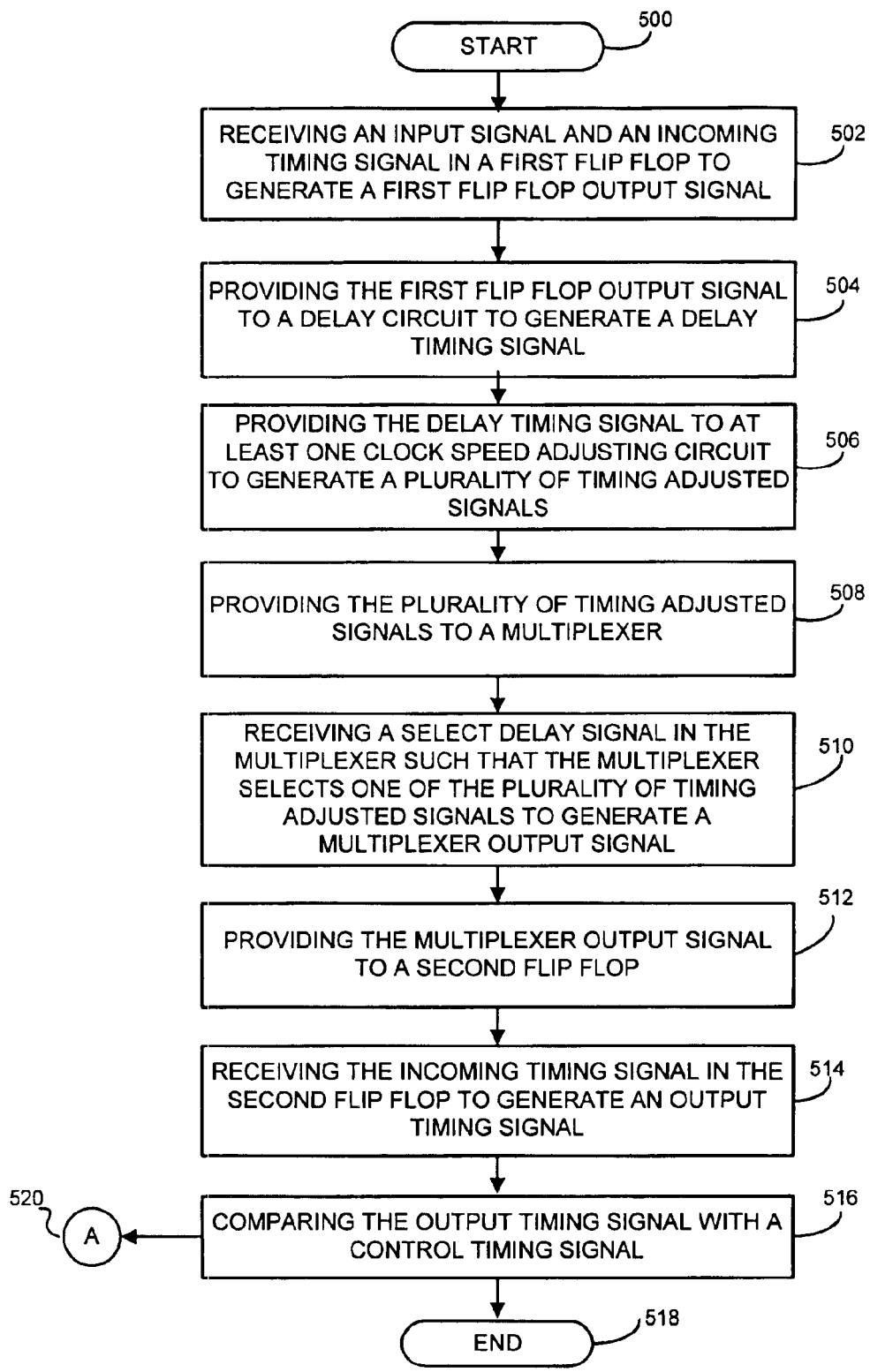
FIG. 5 illustrates a flow chart of a method for determining a processing speed of an integrated circuit.

FIG. 5 illustrates a flow chart representing the steps of a method for determining a processing speed of an integrated circuit. The method begins, step 500, by receiving input signal and an incoming timing signal and a first flip flop to generate a first flip flop output signal, step 502. Similar to the discussion above with regards to FIG. 1, the input signal 106 is received by the first flip flop, 104, as well as the incoming timing signal 110 such that the first flip flop output signal 114 is generated.

The next step, step 504, is providing the first flip flop output signal to a delay circuit to generate a delay timing signal. Once again, the first flip flop output signal 114 is provided for the delay 120 as illustrated in FIG. 1 to generate the delay timing signal 122. The delay timing signals are provided to at least one clock speed adjusting circuit such that a plurality of timing adjusted signals are generated, step 506. In the embodiment described above, four speed adjusting circuits are utilized in conjunction with a timing diagram having no clock speed adjustment, such that the signals 122, 134, 136, 138 and 144 are generated. The plurality of timing adjusted signals are thereupon provided to a multiplexer, step 508. The signals 122, 134, 136, 138 and 140 are provided to the multiplexer 132.

The next step, step 510, is receiving a select delay signal in the multiplexer such that the multiplexer selects one of the plurality of timing adjusted signals to generate a multiplexer output signal. Multiplexer 132 receives the select delay signal 142 to generate the multiplexer output signal 144. Thereupon, the multiplexer output signal is provided to a second flip flop, step 512. Also, the incoming timing signal is further received by the second flip flop to generate an output timing signal, step 514. The second flip flop 146 receives the incoming timing signal 110 and the multiplexer output signal 144 to generate the output timing signal 152.

The next step of the method, step 516, includes comparing the output timing signal with a control timing signal. As discussed above with regards to FIG. 3, the control timing signal 316 is compared with the output timing signal 152 using, in one embodiment, a logic gate 318. Thereupon, based on the comparison of the output timing signal 152 relative to the control timing signal 316 the processing speed of the integrated circuit may be determined, thereupon the method is complete, step 518. In another embodiment, further method steps may be performed as indicated by reference block A, 520.

Figure 6:
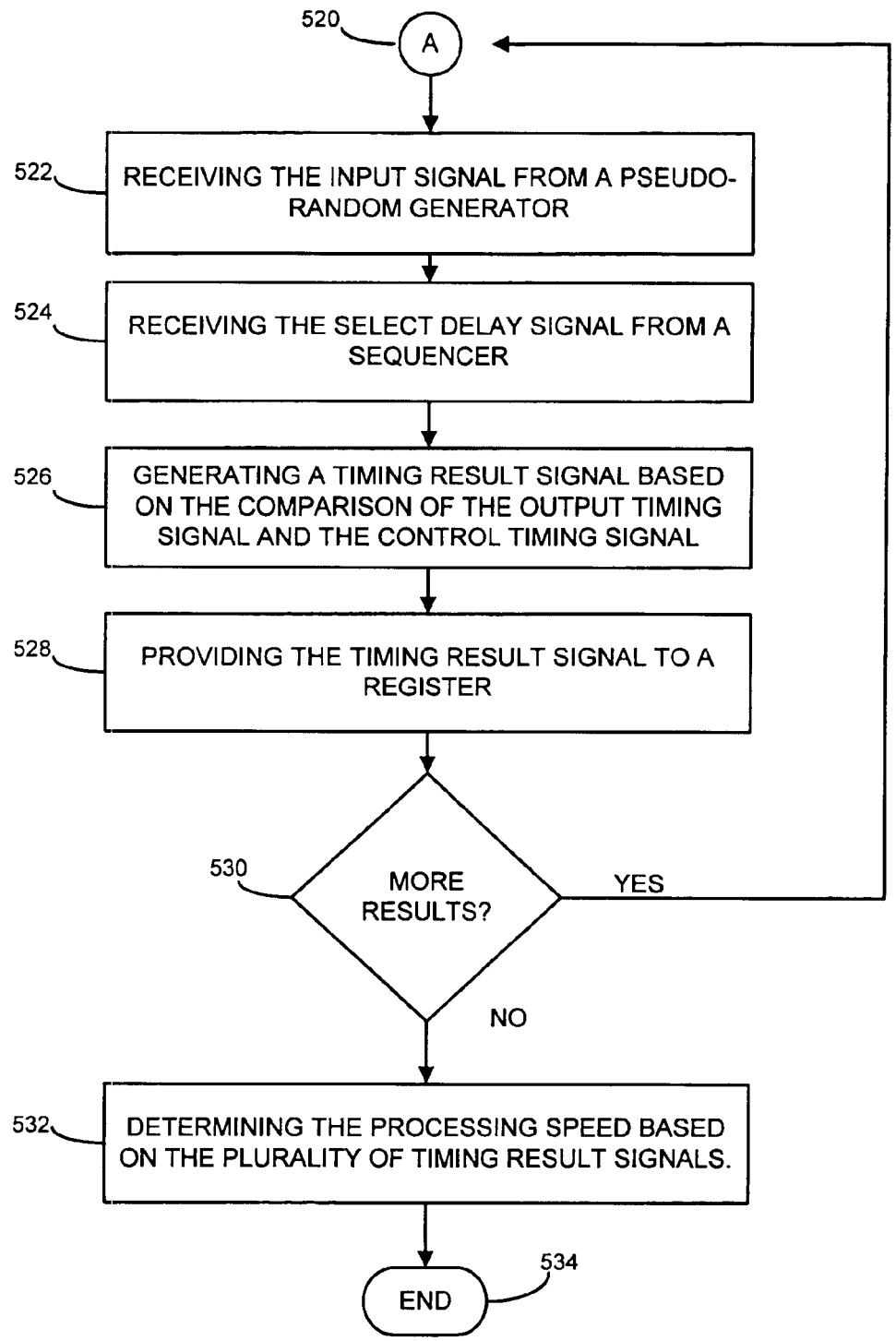
FIG. 6 illustrates a flow chart of an alternative method for determining the processing speed of an integrated circuit in accordance with one embodiment of the present invention.

FIG. 6 illustrates further steps of an alternative method for determining a processing speed of an integrated circuit. The method continues, step 520, relative to the completion of step 516 in the method illustrated in the flow chart of FIG. 5. The next step, step 522, is receiving the input signal from a pseudo-random generator, such as the pseudo-random generator 302 of FIG. 3. The next step, step 524, is receiving the select delay signal from a sequencer, such as the sequencer 304 of FIG. 3.

Thereupon, the method includes generating a timing result signal based on the comparison of the output timing signal and the control timing signal, step 526. The output timing signal 152 may be compared relative to the control timing signal 316 using the control logic 318 as discussed above with regards to FIG. 3. Thereupon, the timing result signal may be provided to a register, step 528. In one embodiment, the register 320 may store the timing result signal 324. A determination is made whether more results are required to properly determine the processing speed of the integrated circuit, step 530. In the event more results are requested or required, the method repeats to step 520, receiving another input signal and another select delay signal. When no more results are to be detected, the next step, step 532, is determining the processing speed based on the plurality of timing result signals. Similar to the discussion regarding the timing diagram of FIG. 4, the processing speed is determined based upon, in one embodiment, the delay branches meeting specific set up timing requirements for associated flip flops. Thereupon, the method is complete, step 534.

Figure 7:
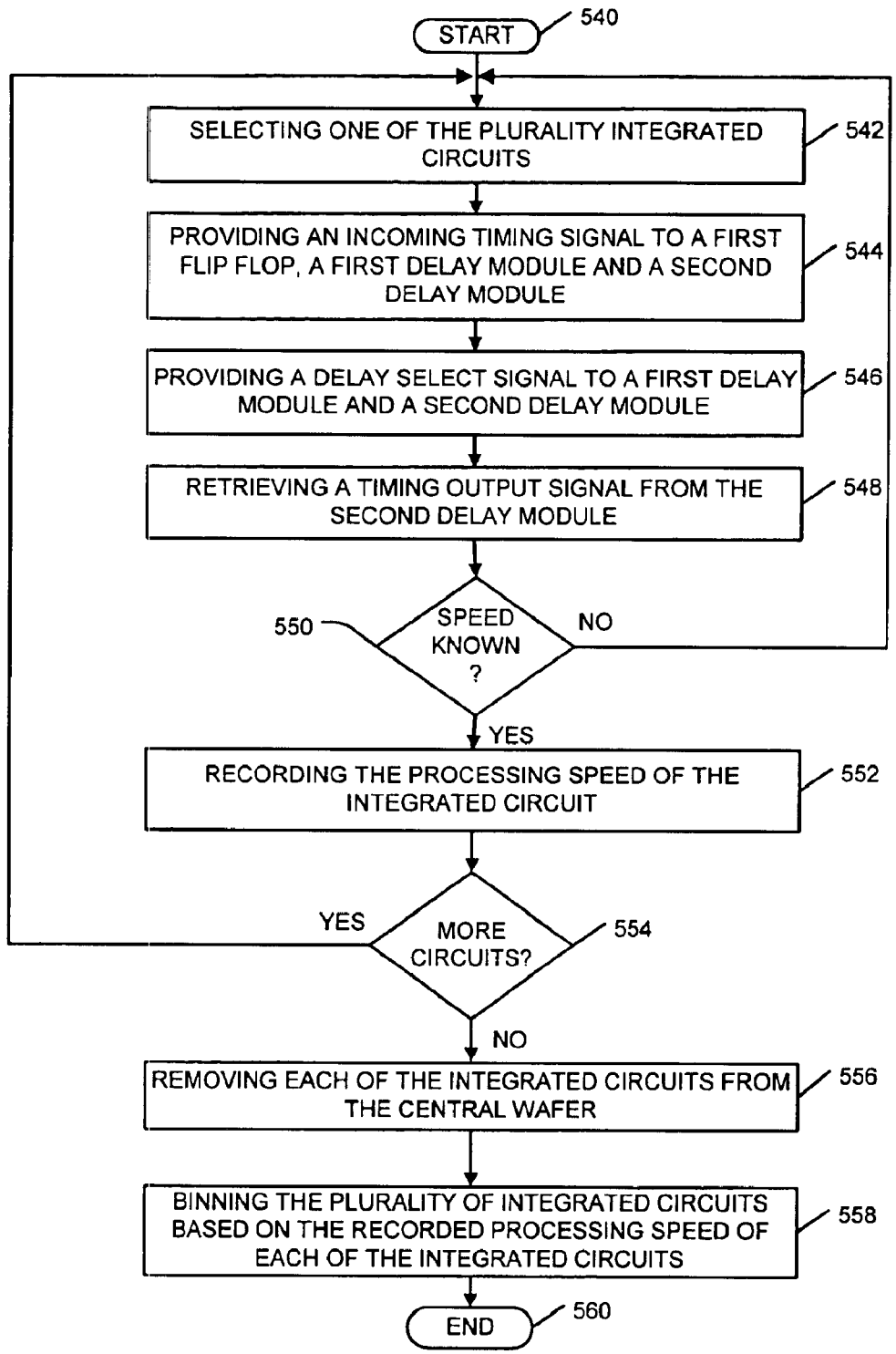
FIG. 7 illustrates a method for determining the processing speed of an integrated circuit and performing a binning operation thereon, in accordance with one embodiment of the present invention.

FIG. 7 illustrates a method for determining a processing speed of an integrated circuit and utilizing the processing speed determination in conjunction with a binning process for sorting the plurality of integrated circuits. The method begins, step 540, by selecting one of the plurality of integrated circuits, step 542. In one embodiment, the plurality of integrated circuits may now be disposed within a wafer wherein the integrated circuits are etched into the wafer die, prior to cutting of the wafer. In a manufacturing embodiment, the integrated circuit may be selected by placing a control module over a particular integrated circuit on the pre-cut wafer. The next step, step 544, is providing an incoming timing signal to a first flip flop, a first delay module and a second delay module. Similar to the embodiment described above with regards to FIG. 2, the three flop module 200 receives the incoming timing signal. Moreover, the next step includes providing a delay signal to the first delay module and a second delay module, step 546. Once again, as discussed above in one embodiment with regards to FIG. 2, the delay select signal 142 is provided to the three flop module 200.

The method further includes retrieving a timing output signal from the second delay module, step 548. Based on different embodiments, the timing output signal may be retrieved directly from the second delay module or may be, in another embodiment, retrieved from the logic gate flip flop 322 as illustrated in FIG. 3. If more results are required to determine the processing speed of the select integrated circuit are required, step 550, the method reverts back to step 542 for re-execution of step 542 through 548. Once the processing speed of the integrated circuit has been determined, the processing speed of the integrated circuit is recorded, step 552. Recording of the processing speed may be performed in any suitable manner to indicate the category or specific processing speed of the selected integrated circuit operates at. For example, in one embodiment, the integrated circuit may be etched with a particular code, such as a bar code, to represent the operating speed. Although any other suitable recording technique, such as recording the speed of the circuit relative to the circuit's location within an external database, may be provided and within the scope of the present invention.

The next step of the method is determining if there are more integrated circuits on the wafer for the determination of the integrated circuit processing speed. If there are more circuits, step 554, the method once again reverts back to step 542 whereupon steps 542 through 552 are repeated.

When there are no more integrated circuits for determining the processing speed thereof on the wafer, the next step is removing each of the integrated circuits from the central wafer, step 556. Thereupon, each of the plurality of integrated circuits may be binned based on the recorded processing speed of each integrated circuit, step 558. Thereupon, the method is complete, step 560. The above method improves the binning process for a wafer having a plurality of integrated circuits disposed thereon such that each of the plurality of integrated circuits may be tested for a processing speed and effectively distributed or binned relative to its internal processing speed.

In one embodiment, the apparatus for determining the processing speed of the integrated circuit requires very little real estate relative to other elements within the integrated circuit. Therefore, based on the reduced size, multiple apparatuses for determining the processing speed may be disposed at various locations throughout the integrated circuit and throughout a wafer containing a plurality of integrated circuits for allowing for the determination of cross sectional measurements of multiple locations to accurately and efficiently determine integrated circuit processing speed without taking up valuable real estate on the integrated circuit dye.

It should be understood that the implementation of other variations and modifications of the invention and its various aspects will be apparent to those of ordinary skill in the art, and that the invention is not limited by the specific embodiments described herein. For example, module 200 may be modified to include any number of delay modules effectively increasing the reliability of the output signal 152. It is therefore contemplated to cover by the present invention, any and all modifications, variations or equivalents that fall within the spirit and scope of the basic underlying principles disclosed in claims herein.

What is claimed is:

1. An apparatus for determining a processing speed of an integrated circuit, the apparatus comprising:

a first flip flop having an input port operative to receive an input signal, an output port operative to provide a flip flop output signal and a timing port operative to receive an incoming clock signal;

a delay circuit operably coupled to the output port of the first flip flop such that the delay circuit is operative to receive the flip flop output signal and generating a delay timing signal;

at least one clock speed adjusting circuit operably coupled to the delay circuit;

a multiplexer operably coupled to the at least one clock speed adjusting circuit and the delay circuit, wherein the multiplexer has a select delay input port operative to receive a select delay signal such that the multiplexer generates a multiplexer output signal corresponding to at least one of: an output signal generated by the at least one clock speed adjusting circuit and the delay timing signal; and a second flip flop having input port operative to receive the multiplexer output signal, an output port operative to provide a timing output signal and a timing port capable of receiving the incoming clock signal.

2. The apparatus of claim 1 further comprising:

a pseudo-random input generator operably coupled to the first flip flop, such that the pseudo-random input generator generates the input signal.

3. The apparatus of claim 2 further comprising:

a sequencer operably coupled to the multiplexer, such that the sequencer generates the select delay signal.

4. The apparatus of claim 1 further comprising:

a logic gate coupled to the second flip flop such that the logic gate receives the timing output signal and generates a timing indicator signal.

5. The apparatus of claim 1 further comprising:

a pseudo-random input generator operably coupled to the first flip flop, such that the pseudo-random input generator generates the input signal;

a sequencer operably coupled to the multiplexer, such that the sequencer generates the select delay signal;

a logic gate coupled to the second flip flop such that the logic gate receives the timing output signal and generates a timing indicator signal; and a register coupled to receive the select delay signal and the timing indication signal.

6. The apparatus of claim 1 wherein the delay circuit includes at least one delay buffer and a plurality of gates.

7. The apparatus of claim 1 wherein the at least one clock speed adjusting circuit includes at least one delay buffer and a plurality of gates.

8. An apparatus for determining a processing speed of an integrated circuit, the apparatus comprising:

a first flip flop having an input port capable of receiving an input signal, an output port operative to provide a flip flop output signal and a timing port operative to provide an incoming clock signal;

a first delay module coupled to the first flip flop such that the first delay module receives the flip flop output signal, the first delay module operably coupled to receive the incoming clock signal and operably coupled to receive a select delay signal;

a second delay module coupled to the first delay module the second delay module receives an interim timing output signal from the first delay module, the second delay module operably coupled to receive the incoming clock signal, such that the second delay module generates a timing output signal; and a logic gate coupled to the second flip flop such that the logic gate receives the timing output signal and generates a timing indicator signal.

9. An apparatus for determining a processing speed of an integrated circuit, the apparatus comprising:

a first flip flop having an input port operative to receive an output signal, an output port operative to provide a flip flop output signal and a timing port operative to receive an incoming clock signal;

a first delay module coupled to the first flip flop such that the first delay module receives the flip flop output signal, the first delay module operably coupled to receive the incoming clock signal and operably coupled to receive a select delay signal;

a second delay module coupled to the first delay module such that the second delay module receives an interim timing output signal from the first delay module, the second delay module operably coupled to receive the incoming clock signal, such that the second delay module generates a timing out put signal; and a pseudo-random input generator operably coupled to the first flip flop, such that the pseudo-random input generator generates the input signal.

10. An apparatus for determining a processing speed of an integrated circuit, the apparatus further comprising:

a first flip flop having an input port operative to provide an input signal, an output port operative to provide a flip flop output signal and a timing port operative to receive an incoming clock signal;

a first delay module coupled to the first flip flop such that the first delay module receives the flip flop output signal, the first delay module operably coupled to receive the incoming clock signal and operably coupled to receive a select delay signal;

a second delay module coupled to the first delay module such that the second delay module receives an interim timing output signal from the first delay module, the second delay module operably coupled to receive the incoming clock signal, such that the second delay module generates a timing output signal; and a sequencer operably coupled to the multiplexer, such that the sequencer generates the select delay signal.

11. The apparatus of claim 8 further comprising:

a pseudo-random input generator operably coupled to the first flip flop, such that the pseudo-random input generator generates the input signal;

a sequencer operably coupled to the multiplexer, such that the sequencer generates the select delay signal; and a register coupled to receive the select delay signal and the timing indication signal.

12. The apparatus of claim 11 further comprising:

a plurality of control timing flip flops operably coupled to the pseudo-random input generator and coupled to receive the incoming clock signal such that the plurality of control timing flip flops generate a control timing signal, wherein the control timing signal is provided to the logic gate for comparison with the timing indicator signal; and a logic gate flip flop coupled between the logic gate and the registers, wherein the logic gate flip flop is operably coupled to receive the incoming clock signal and the timing indicator signal and generate a timing result signal provided to the register.

13. An apparatus for determining a processing speed of an integrated circuit, wherein the first delay module includes:

a first flip flop having an input port operative to receive an input signal, an output port operative to provide a flip flop output signal and a timing port operative to receive an incoming clock signal;

a first delay module coupled to the first flip flop such that the first delay module receives the flip flop output signal, the first delay module operably coupled to receive the incoming clock signal and operably coupled to receive a select delay signal;

a second delay module coupled to the first delay module such that the second delay module receives an interim timing output signal from the first delay module, the second delay module operably coupled to receive the incoming clock signal, such that the second delay module generates a timing output signal;

a logic gate coupled to the second flip flop such that the logic gate receives the timing output signal and generates a timing indicator signal; and a first delay circuit operably coupled to the output port of the first flip flop such that the first delay circuit is capable of receiving the flip flop output signal and generating a first delay timing signal;

at least one clock speed adjusting circuit operably coupled to the first delay circuit;

a first multiplexer operably coupled to the at least one clock speed adjusting circuit and the delay circuit, wherein the first multiplexer has a select delay input port capable of receiving the select delay signal such that the first multiplexer generates a first multiplexer output signal corresponding to at least one of: an output signal generated by the at least one clock speed adjusting circuit and the delay timing signal; and a second flip flop having an input port capable of receiving the first multiplexer output signal, an output port capable of providing the interim timing output signal and a timing port capable of receiving the incoming clock signal.

14. An apparatus for determining a processing speed of an integrated circuit, wherein the second delay module includes:

a first flip flop having an input port operative to receive an output signal, an output port operative to provide a flip flop output signal and a timing port capable of receiving an incoming clock signal;

a first delay module coupled to the first flip flop such that the first delay module receives the flip flop output signal, the first delay module operably coupled to receive the incoming clock signal and operably coupled to receive a select delay signal;

a second delay module coupled to the first delay module such that the second delay module receives an interim timing output signal from the first delay module, the second delay module operably coupled to receive the incoming clock signal, such that the second delay module generates a timing output signal;

a second delay circuit operably coupled to the output port of the second flip flop such that the second delay circuit is capable of receiving the flip flop output signal and generating a second delay timing signal;

at least one clock speed adjusting circuit operably coupled to the second delay circuit;

a second multiplexer operably coupled to the at least one clock speed adjusting circuit and the delay circuit, wherein the second multiplexer has a select delay input port capable of receiving the select delay signal such that the second multiplexer generates a second multiplexer output signal corresponding to an output signal generated by at least one of: the at least one clock speed adjusting circuit and the delay timing signal; and a third flip flop having an input port operative to receive the second multiplexer output signal, an output port operative to provide the timing output signal and a timing port operative to receive the incoming clock signal.

15. A method for determining a processing speed of an integrated circuit comprising:
    (a) receiving an input signal and an incoming timing signal in a first flip flop to generate a first flip flop output signal;
    (b) providing the first flip flop output signal to a delay circuit to generate a delay timing signal;
    (c) providing the delay timing signal to at least one clock speed adjusting circuit to generate a plurality of timing adjusted signals;
    (d) providing the plurality of timing adjusted signals to a multiplexer;
    (e) receiving a select delay signal in the multiplexer such that the multiplexer selects one of the plurality of timing adjusted signals to generate a multiplexer output signal;
    (f) providing the multiplexer output signal to a second flip flop;
    (g) receiving the incoming timing signal in the second flip flop to generate an output timing signal; and
    (h) comparing the output timing signal with a control timing signal.

16. The method of claim 15 further comprising:
    (i) receiving the input signal from a pseudo-random generator;
    (j) receiving the select delay signal from a sequencer; and
    (k) generating a timing result signal based on the comparison of the output timing signal and the control timing signal.

17. The method of claim 16 further comprising:
    (l) providing the timing result signal to a register.

18. The method of claim 17 further comprising:
    (m) repeating (a) through (l) to generating a plurality of timing result signals; and
    (n) calculating the processing speed of the integrated circuit based on the plurality of timing result signals.

19. An apparatus for determining a processing speed of an integrated circuit, the apparatus comprising:
    a first flip flop having an input port operative to receive an input signal, an output port, operative to provide a flip flop output signal and a timing port operative to receive an incoming clock signal;
    a first delay module coupled to the first flip flop such that the first delay module receives the flip flop output signal, the first delay module operably coupled to receive the incoming clock signal and operably coupled to receive a select delay signal, wherein the first delay module includes:
        a first delay circuit operably coupled to the output port of the first flip flop such that the first delay circuit is capable of receiving the flip flop output signal and generating a first delay timing signal;
        at least one clock speed adjusting circuit operably coupled to the first delay circuit;
        a first multiplexer operably coupled to the at least one clock speed adjusting circuit and the delay circuit, wherein the first multiplexer has a select delay input port operative to receive the select delay signal such that the first multiplexer generates a first multiplexer output signal corresponding to at least one of: an output signal generated by the at least one clock speed adjusting circuit and the delay timing signal; and
    a second flip flop having an input port operative to receive the first multiplexer output signal, an output port operative to provide the interim timing output signal and a timing port operative to receive the incoming clock signal; and
    a second delay module coupled to the first delay module such that the second delay module receives an interim timing output signal from the first delay module, the second delay operably coupled to receive the incoming clock signal, such that the second delay module generates a timing output signal, wherein the second delay module includes:
        a second delay circuit operably coupled to the output port of the second flip flop such that the second delay circuit is operative to receive the flip flop output signal and generating a second delay timing signal;
        at least one clock speed adjusting circuit operably coupled to the second delay circuit;
        a second multiplexer operably coupled to the at least one clock speed adjusting circuit and the delay circuit, wherein the second multiplexer has a select delay input port operative to receive the select delay signal such that the second multiplexer generates a second multiplexer output signal corresponding to an output signal generated by at least one of: the at least one clock speed adjusting circuit and the delay timing signal; and
        a third flip flop having an input port operative to receive the second multiplexer output signal, an output port operative to provide the timing output signal and a timing port operative to receive the incoming clock signal.

20. The apparatus of claim 19, further comprising:
    a pseudo-random input generator operably coupled to the first flip flop, such that the pseudo-random input generator generates the input signal;
    a sequencer operably coupled to the multiplexer, such that the sequencer generates the select delay signal;
    a logic gate coupled to the second flip flop such that the logic gate receives the timing output signal and generates a timing indicator signal; and
    a register coupled to receive the select delay signal and the timing indication signal.

21. The apparatus of claim 20 further comprising:
    a plurality of control timing flip flops operably coupled to the pseudo random generator and coupled to receive the incoming clock signal such that the plurality of control timing flip flops generate a control timing signal, wherein the control timing signal is provided to the logic gate for comparison with the timing indicator signal; and
    a logic gate flip flop coupled between the logic gate and the register wherein the logic gate flip flop is operably coupled to receive the incoming clock signal and the select delay signal and generate a timing result signal provided to the register.

22. A method of determining processing speeds for a plurality of integrated circuits and categorizing the integrated circuits based on the determined processing speeds, the method comprising:

(a) selecting one of the plurality integrated circuits;

(b) providing an incoming timing signal to a first flip flop, a first delay module and a second delay module;

(c) providing a delay select signal to a first delay module and a second delay module;

(d) retriveing a timing output signal from the second delay module;

(e) repeating steps (b) through (d) until the processing speed of the integrated circuit is determined; and (f) recording the processing speed of the integrated circuit.

23. The method of claim 22 further comprising:

(g) repeating steps (a) through (f) for each of the plurality of integrated circuits.

24. The method of claim 23 further comprising:

(h) binning the plurality of integrated circuits based on the recorded processing speed of each of the integrated circuits.

25. The method of claim 22 wherein the plurality of integrated circuits are disposed on a central wafer such that the step (f) further includes:

(f1) etching a processing speed indicator on each of the integrated circuits.

26. The method of claim 25 further comprising:

(g) repeating steps (a) through (f) for each of the plurality of integrated circuits;

(h) removing each of the integrated circuits from the central wafer; and (i) binning the plurality of integrated circuits based on the recorded processing speed of each of the integrated circuits.

27. The method of claim 22 wherein:

first delay module includes:

a first delay circuit operably coupled to an output port of the first flip flop such that the first delay circuit is capable of receiving a flip flop output signal and generating a first delay timing signal;

at least one clock speed adjusting circuit operably coupled to the first delay circuit;

a first multiplexer operably coupled to the at least one clock speed adjusting circuit and the delay circuit, wherein the first multiplexer has a select delay input port operative to receive the select delay signal such that the first multiplexer generates a first multiplexer output signal corresponding to at least one of: an output signal generated by the at least one clock speed adjusting circuit and the delay timing signal; and a second flip flop having an input port operative to receive the first multiplexer output signal, an output port operative to provide the interim timing output signal and a timing port operative to receive the incoming clock signal; and the second delay module includes;

a second delay circuit operably coupled to the output port of the second flip flop such that the second delay circuit is operative to receive the flip flop output signal and generating a second delay timing signal;

at least one clock speed adjusting circuit operably coupled to the second delay circuit;

a second multiplexer operably coupled to the at least one clock speed adjusting circuit and the delay circuit, wherein the second multiplexer has a select delay input port capable of receiving the select delay signal such that the second multiplexer generates a second multiplexer output signal corresponding to an output signal generated by at least one of: the at least one clock speed adjusting circuit and the delay timing signal; and a third flip flop having an input port operative to receive the second multiplexer output signal, an output port operative to provide the timing output signal and a timing port operative to receive the incoming clock signal.

* * * * *